United States Patent [19]

Nelson et al.

[11] Patent Number: 5,132,873

[45] Date of Patent: Jul. 21, 1992

[54] DIAPHRAGM SEALING APPARATUS

[75] Inventors: Richard D. Nelson, Austin, Tex.; Omkarnath R. Gupta, Englewood, Colo.; Dennis J. Herrell, Austin, Tex.

[73] Assignee: Microelectronics and Computer Technology Corporation, Austin, Tex.

[21] Appl. No.: 663,062

[22] Filed: Feb. 28, 1991

Related U.S. Application Data

[60] Continuation of Ser. No. 594,785, Oct. 9, 1990, abandoned, which is a division of Ser. No. 251,272, Sep. 30, 1988, abandoned.

[51] Int. Cl.⁵ .............................................. H05K 7/20
[52] U.S. Cl. ................... 361/385; 165/80.3; 165/80.4; 357/82; 361/386
[58] Field of Search ................. 357/81, 82; 361/382-389; 165/46, 80.3, 80.4, 104.33, 185

[56] References Cited

U.S. PATENT DOCUMENTS

| | | | |
|---|---|---|---|
| 3,826,957 | 7/1974 | McLaughlin et al. | 317/234 R |
| 4,037,270 | 7/1977 | Ahmann et al. | 361/385 |
| 4,040,172 | 8/1977 | Kurtz et al. | 29/580 |
| 4,109,707 | 8/1978 | Wilson et al. | 165/46 |
| 4,274,106 | 6/1981 | Ohdate | 357/79 |
| 4,381,032 | 4/1983 | Cutchaw | 165/46 |
| 4,386,362 | 5/1983 | Kessler, Jr. et al. | 357/68 |
| 4,558,395 | 12/1985 | Yamada | 361/386 |
| 4,567,505 | 1/1986 | Pease et al. | 357/81 |
| 4,612,978 | 9/1986 | Cutchaw | 361/385 |
| 4,675,475 | 6/1987 | Krumme | 361/403 |
| 4,729,060 | 3/1988 | Yamamoto et al. | 361/385 |
| 4,730,665 | 3/1988 | Cutchaw | 165/80.4 |
| 4,748,495 | 5/1988 | Kucharek | 357/82 |
| 4,783,721 | 11/1988 | Yamamoto et al. | 361/382 |
| 4,800,422 | 1/1989 | Sanwo et al. | 357/82 |
| 4,861,240 | 8/1989 | Knutti et al. | 156/633 |
| 4,879,629 | 11/1989 | Tustaniwskyj | 361/385 |
| 4,933,747 | 6/1990 | Schroeder | 357/82 |

FOREIGN PATENT DOCUMENTS

| | | |
|---|---|---|
| 85400098.1 | 1/1985 | European Pat. Off. |
| 54-138376 | 10/1979 | Japan |
| 57-124454 | 8/1982 | Japan |
| 59-197610 | 4/1983 | Japan |
| 60-72252 | 4/1985 | Japan |
| 61-7651 | 1/1986 | Japan |
| 61-104648 | 5/1986 | Japan |
| 61-281540 | 12/1986 | Japan |
| 62-136055 | 6/1987 | Japan |
| 63-28095 | 2/1988 | Japan |
| 1-41249 | 2/1989 | Japan |
| 1-61039 | 3/1989 | Japan |
| 1-216817 | 8/1989 | Japan |

OTHER PUBLICATIONS

Blake et al., "Packaging Structure," IBM Technical Disclosure, vol. 21, No. 1, Jun. 1978, pp. 183–184.
Seely, "Combination Cooling System," IBM Technical Disclosure, vol. 11, No. 7, Dec. 1968, pp. 838–839.
Tadaki et al, "Thermal Cycling Effects in an Aged Ni-rich Ti-Ni Shape Memory Alloy," Transactions of the Japan Insttute of Metals, vol. 28, No. 11 (1987), pp. 883–890.

*Primary Examiner*—Gerald P. Tolin
*Attorney, Agent, or Firm*—Fulbright & Jaworski

[57] ABSTRACT

An article provides sealing of an electronic component connected to a mating fluid heat exchanger by providing a diaphragm with an opening shaped to fit about the heat exchanger, the opening forming a sealing lip. A clamping ring, which expands and contracts as a function of temperature is placed around the lip of the diaphragm and subject to a temperature to shrink the clamping ring against the lip and heat exchanger for sealing the diaphragm thereto. Preferably the clamping ring is a shape memory alloy metal. In addition, a compressible metal seal may be placed between the lip and the heat exchanger to increase the ability to seal.

4 Claims, 2 Drawing Sheets

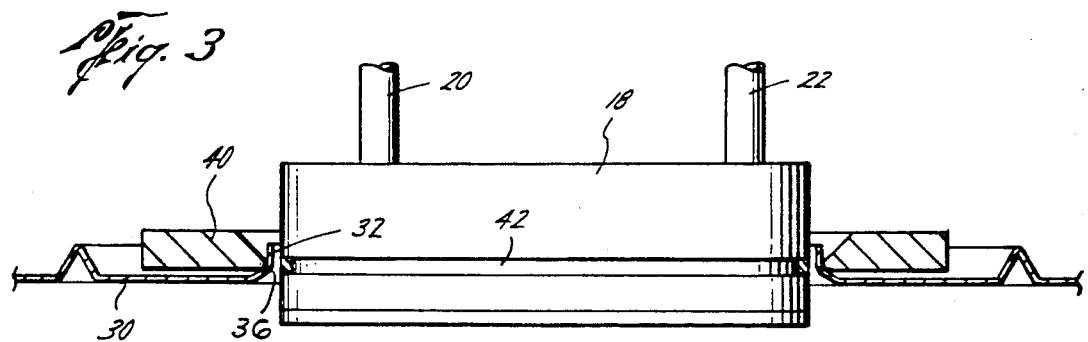
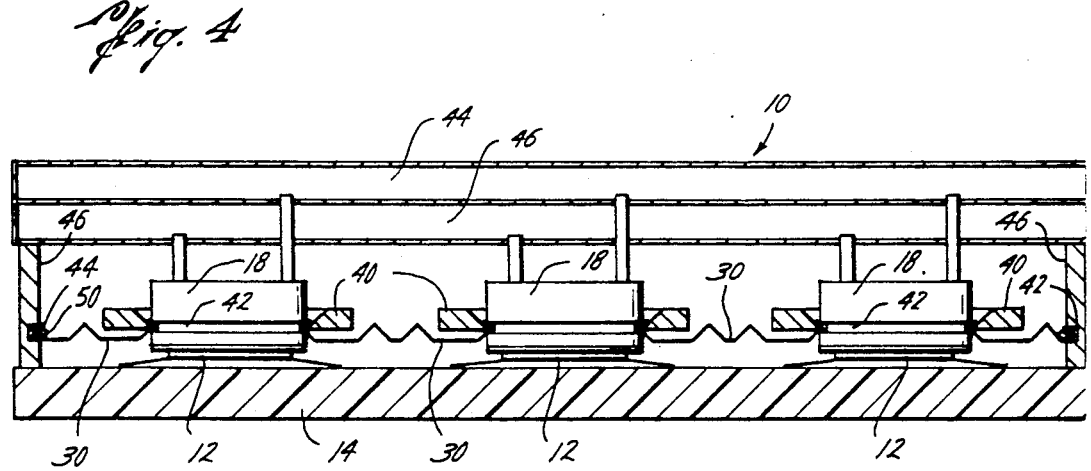
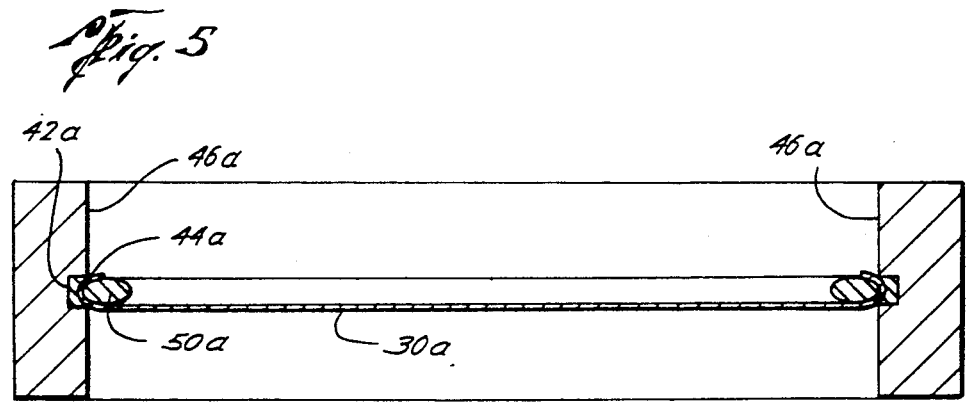

ically sealed to protect the chips from
the moisture in the air. When water cooling is used, it is
necessary to protect the chips from water vapor or
liquid corrosion. When the chip is mated to a liquid
cooled heat exchanger the problem is especially severe
and a diaphragm hermetic boundary is sometimes used.

The present invention describes a sealing method and
apparatus for a sealing diaphragm which can be assembled and disassembled without requiring solders or high
temperature brazing. In addition, the sealing diaphragm
is positioned to avoid a thermal impedance to the cooling process by being positioned out of the path between
the chip and the heat exchanger.

SUMMARY

The present invention is directed to a method of
sealing around the periphery of a body by providing a
diaphragm with a mating edge shaped to fit the periphery of the body and forming a sealing lip on the mating
edge. A clamping ring is provided which has a shape to
conform to the periphery of the body. The method
includes retracting the clamping ring away from the
periphery, placing the sealing lip of the diaphragm
around the periphery of the body, and placing the
clamping ring over the lip. The clamping ring is then
subjected to a temperature sufficient to force the clamping ring against the periphery of the body for sealing the
lip to the periphery.

Still a further object of the present invention is
wherein the clamping ring is a shape memory alloy
metal.

Still a further object of the present invention is the
provision of a compressible seal between the lip and the
periphery of the body for increasing the ability of the lip
to seal under pressure.

Still a further object is wherein the diaphragm, ring,
and seal are of metal.

Yet a still further object of the present invention is the
method of sealing an electric chip connected to a mating fluid heat exchanger by providing a metal diaphragm with an opening having a mating edge shaped
to fit about the periphery of the heat exchanger and
forming a sealing lip thereon. A clamping ring is provided having a shape to conform to the periphery of the
heat exchanger. The clamping ring is retracted for fitting over the periphery of the heat exchanger. The lip is
placed around the periphery of the heat exchanger and
the clamping ring is placed over the lip and subjected to
a temperature sufficient to force the clamping ring
against the periphery of the heat exchanger for sealing
the lip to the heat exchanger.

Yet a still further object of the present invention is the
provision of an electronic package having one or more
electronic chips having a mating heat exchanger with a
supporting substrate connected to the chips. A diaphragm covers the chips and the substrate and includes
an opening having a mating edge around each heat
exchanger in which the mating edge includes a sealing
lip. A metal clamping ring is positioned about each
sealing lip for hermetically sealing the lip around the
heat exchanger. Preferably, the diaphragm is metal and
a compressible metal seal is provided between each lip
and heat exchanger.

Still a further object is the provision of an enclosure
about the chips and heat exchangers and said diaphragm
includes an outer edge having an outer mating lip fitting
around the inside periphery of the enclosure, and a
second clamping ring positioned inside the outer mating
lip for hermetically sealing the outer mating lip to the
inside periphery of the enclosure.

Yet a further object is the provision of various types
of metal clamping rings such as shape memory alloy
rings which revert to their original shape on heating,
and metal rings which expand or retract upon increase
or decrease in temperature, either of which can be used
to seal a diaphragm to the outside periphery or the
inside periphery of a body.

Other and further objects, features and advantages
will be apparent from the following description of a
presently preferred embodiment of the invention, given
for the purpose of disclosure and taken in conjunction
with the accompanying drawings.

BRIEF DESCRIPTION OF THE DRAWINGS

FIG. 3 is an elevational view, partly in cross section,
of the diaphragm and clamping ring of FIG. 1 in a
position disconnected from the heat exchanger,
FIG. 4 is an elevational view, partly schematic, illustrating a multichip electronic package in which a diaphragm seals and protects the chips,
and FIG. 5 is an elevational view, in cross section, illustrating a sealing of a diaphragm to an enclosing body.

DESCRIPTION OF THE PREFERRED EMBODIMENT

Figure 1:
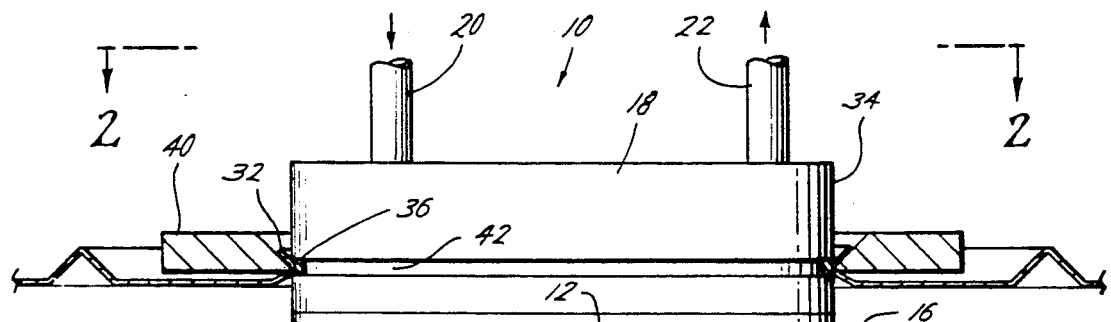
FIG. 1 is an elevational view, partly in cross section,
illustrating a diaphragm seal connected and protecting
an electronic chip which is mated to a fluid heat exchanger.
Figure 2:
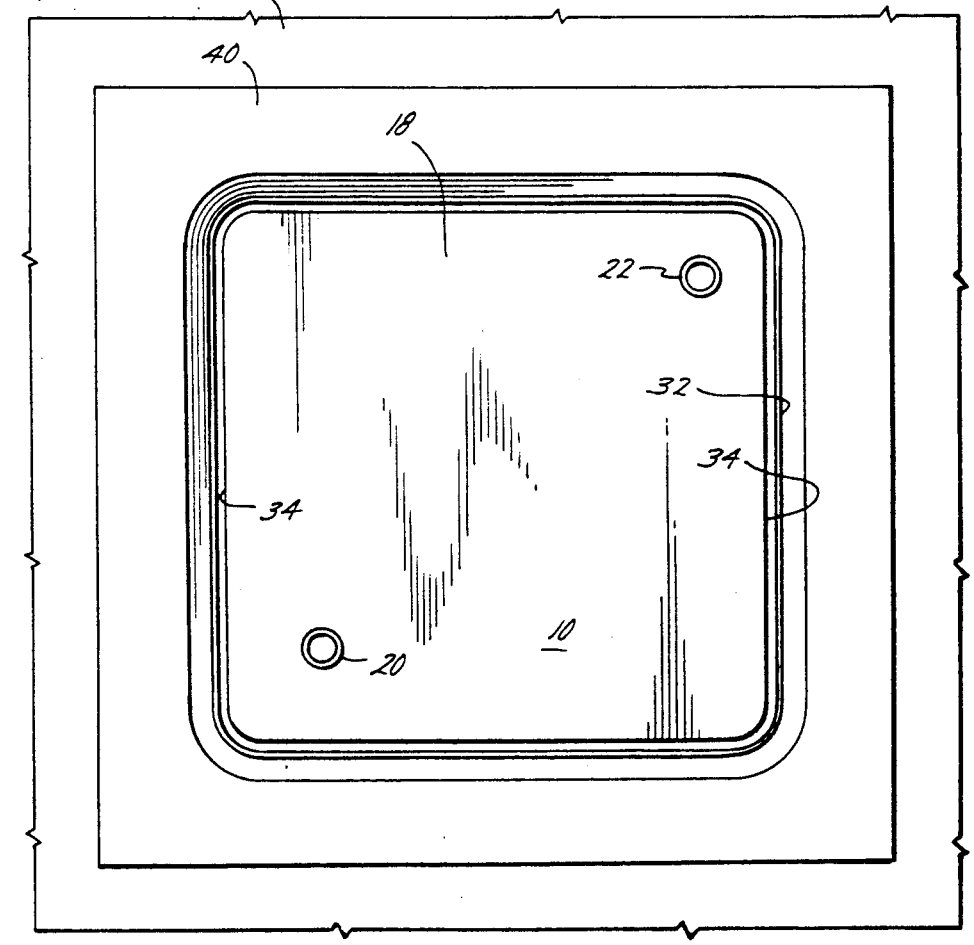
FIG. 2 is a cross-sectional view, taken along the line
2—2 of FIG. 1.

Referring now to the drawings, and particularly to
FIGS. 1 and 2, the reference numeral 10 generally indicates an electronic package generally including an electronic chip 12 which is connected to a substrate 14 by
any suitable electrical connections 16 and a heat exchanger 18 which mates with the electronic chip 12 for
cooling the chip 12. The heat exchanger 18 may be of
any conventional type, such as a water cooled type, and
generally includes a liquid inlet 20 and a liquid outlet 22.
It is important to protect the chip 14 from water vapor
or liquid corrosion from the heat exchanger 18 and its
connections, but without interfering with the thermal
connection between the chip 12 and heat exchanger 18.

The present invention provides a diaphragm 30 such
as a metal diaphragm, for example, an aluminum diaphragm of 0.002 inches thick which is provided with an
opening having a mating edge 32 shaped to fit about the
periphery 34 of the heat exchanger 18. The mating edge
32 includes a sealing lip 36 to seal against the outer
periphery 34. The lip may be 0.050 to 0.100 inches. A
clamping ring 40 is provided for clamping the lip 36 to
the outer periphery 34 of the heat exchanger 18. The
clamping ring 40 is shaped to conform to the outer
periphery 34 of the heat exchanger 18. While the clamping ring 40 may be of any suitable metal, it is preferable
that it be a shape memory alloy ring which provides a
means for connecting and disconnecting the diaphragm
to the periphery 34 of the heat exchanger 18 when desired. For example, the shape memory alloy ring 40 may be made of nickel and titanium. The ring is mechanically expanded from the periphery 34 when subjected to a temperature below its transition temperature, as best seen in FIG. 3, so that the ring 40 can slip over the heat exchanger 18 and the lip 36. When the ring 40 is positioned, as shown in FIG. 3, it may be heated above its transition temperature and the ring 40 returns to its original shape and thus shrinks, clamping the diaphragm lip 36 to the periphery 34 of the heat exchanger 18 and effecting a metal-to-metal hermetic seal. The diaphragm 30 and the clamping ring 40 may be formed to accept the shape of the heat exchanger 18 which may be round, oval or rectangular.

The sealing of the diaphragm 30 to the heat exchanger 18 may be disassembled by cooling the ring 40 down below its transition temperature and mechanically expanding away from the heat exchanger 18 or by cutting it off for allowing repair or replacement of parts in an electronic package.

If desired, the diaphragm lip 36 or the peripheral surface 34 of the heat exchanger 18 may have a compressible seal for increasing the ability of the diaphragm 30 to seal under pressure. For example, a soft metal seal ring 42, such as indium, may be provided for providing such a seal.

Referring now FIG. 4, an entire multichip package 10 shown in which a manifold, such as a water manifold includes an inlet manifold 43 and an outlet manifold 45 connected to a plurality of heat exchangers 18 which in turn mate with electronic chips 12 on a substrate 14. The diaphragm 30 covers the substrate 14 and chips 12 and includes openings having a mating edge fitting around each of the heat exchangers 18 and sealed thereto by clamping rings 40 as described above in connection with the detailed description of FIGS. 1-3. In this case, the outer edges 44 of the diaphragm 30 seals to the outer edges 46 of the electronic package 10 for fully protecting the chips 12 and substrate 14 from water vapor, liquid corrosion or moisture in the air. The outer edges 44 of the diaphragm 30 may be connected to the edges 46 by any suitable metals. However, again, a clamping ring 50 may be provided which, when expanded outwardly into engagement with the inner periphery 46 of the package 10, acts to seal a lip 44 at the outer edge of the diaphragm 30 against the inner periphery 46 of the package 10.

The action of the ring 50 for sealing a lip 44 against the periphery 46 is shown in greater detail in FIG. 5 wherein a diaphragm 30a having lips 44a is sealed against the inside of an enclosing body having an inside periphery 46a by a clamping ring 50a. Again, the clamping ring 50a is preferably a shape memory alloy ring of nickel and titanium which upon cooling below its transition temperature is mechanically retracted so as to fit within the enclosing periphery 46a and within the lips 44a and thereafter is heated above its transition temperature for reverting to its original position and thus expanding and sealing the lips 44a against the periphery 46a. In addition, a suitable seal 42a may be used between the lips 44a and the ends 46a.

While the clamping rings 40, 50 and 50a have been described as shape memory alloys, there may be other types of metal rings which expand and retract upon an increase or decrease of temperature, respectively. For example, the rings 40, 50 and 50a may be stainless steel. In this event ring 40 is heated as best shown in FIG. 3 to expand it sufficiently so that the ring 40 can slip over the heat exchanger 18 and the lip 36. When the ring is positioned, as shown in FIG. 3, it is then allowed to cool and the ring 40 shrinks clamping the lip 36 to the outside periphery 34 of the heat exchanger 18 as shown in FIGS. 1, 2 and 4.

Similarly, the rings 50 and 50a may be stainless steel and are cooled sufficiently to contract so that they may fit within the inner peripheries 46 and 46a, respectively. Thereafter, they may be warmed sufficiently for expanding and sealing the lips 44 and 44a, respectively, to the inner periphery of the enclosure 10.

Therefore, the present invention provides an electronic package in which one or more electronic chips may be mated to heat exchangers and a diaphragm may be releasably connected around the heat exchanger for protecting the chips and substrate without interfering with the thermal interface between the heat exchanger and the chips. If any of the parts require repair or replacement, the clamping means may easily be retracted away from their sealing lips and disassembled.

The method of sealing an electronic chip connected to a mating liquid heat exchanger is apparent from the foregoing description of a preferred embodiment but generally includes providing a diaphragm with an opening having a mating edge shaped to fit about the periphery of the heat exchanger and forming a sealing lip on the mating edge. Thereafter, a clamping ring, which has a shape to conform to the periphery of the heat exchanger is provided. The clamping ring is retracted for fitting over the periphery of the heat exchanger. The clamping ring is placed over the lip and around the periphery of the heat exchanger and is subjected to a temperature sufficient to force the clamping ring against the periphery of the heat exchanger for sealing the lip thereto.

The present invention, therefore, is well adapted to carry out the objects and attain the ends and advantages mentioned as well as others inherent therein. While presently preferred embodiments of the invention have been given for the purpose of disclosure, numerous changes in the details of construction and arrangement of parts, and steps of the method, will readily suggest themselves to those skilled in the art and which are ecompassed within the spirit of the invention and the scope of the appended claims.

What is claimed is:

1. An electronic package comprising,
   electronic chips each having a mating heat exchanger,
   a supporting substrate connected to the chips,
   an elongated metal diaphragm covering the chips and substrate, said diaphragm including openings each having a mating edge fitting around the outside periphery of each heat exchanger,
   each mating edge including a sealing lip,
   a metal clamping ring positioned about each sealing lip hermetically sealing each lip around each heat exchanger.

2. The apparatus of claim 1 wherein each clamping ring is a shape memory alloy metal.

3. The apparatus of claim 2 including a compressible metal seal between each lip and heat exchanger.

4. The apparatus of claim 1 including,
   an enclosure about the chips and heat exchangers,
   said diaphragm including an outer edge having an outer mating lip fitted within the inside periphery of the enclosure, and
   an additional metal clamping ring positioned over the outer mating lip hermetically sealing the outer mating lip to the inside periphery of the enclosure.

* * * * *